United States Patent
Du et al.

(10) Patent No.: US 11,904,875 B2
(45) Date of Patent: Feb. 20, 2024

(54) ADAPTIVE PROGNOSTICS SYSTEMS AND METHODS FOR VEHICLES

(71) Applicant: GM GLOBAL TECHNOLOGY OPERATIONS LLC, Detroit, MI (US)

(72) Inventors: Xinyu Du, Oakland Township, MI (US); Atul Nagose, Royal Oak, MI (US); Joshua J. Sanchez, Clinton Township, MI (US); Paul E. Krajewski, Troy, MI (US)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 851 days.

(21) Appl. No.: 16/595,738

(22) Filed: Oct. 8, 2019

(65) Prior Publication Data

US 2021/0101607 A1 Apr. 8, 2021

(51) Int. Cl.
| | |
|---|---|
| *G01M 17/00* | (2006.01) |
| *B60W 50/04* | (2006.01) |
| *G06N 20/00* | (2019.01) |
| *G07C 5/08* | (2006.01) |
| *G06F 30/20* | (2020.01) |
| *B60W 50/00* | (2006.01) |

(52) U.S. Cl.
CPC ............. *B60W 50/04* (2013.01); *G06F 30/20* (2020.01); *G06N 20/00* (2019.01); *G07C 5/085* (2013.01); *G07C 5/0808* (2013.01); *B60W 2050/0028* (2013.01)

(58) Field of Classification Search
CPC ........ B60W 50/04; G06N 20/00; G06F 30/20; G07C 5/0808; G07C 5/085
See application file for complete search history.

(56) References Cited

U.S. PATENT DOCUMENTS

| | | | |
|---|---|---|---|
| 8,301,333 B2 | 10/2012 | Singh et al. | |
| 8,509,985 B2 | 8/2013 | Subramania et al. | |
| 10,534,370 B2* | 1/2020 | Cavalcanti | G08G 1/091 |
| 10,710,602 B2* | 7/2020 | Goldberg | G06F 11/00 |
| 11,227,401 B1* | 1/2022 | Mahieu | G01S 17/89 |
| 2010/0057479 A1 | 3/2010 | De et al. | |
| 2011/0144853 A1 | 6/2011 | Subramania et al. | |
| 2019/0138007 A1* | 5/2019 | Baghsorkhi | B60W 30/08 |

* cited by examiner

*Primary Examiner* — Adam M Alharbi

(57) ABSTRACT

A system includes an assessment module and a training module. The assessment module is configured to receive event data about an event associated with a subsystem of a vehicle. The assessment module is configured to determine deviations between reference data for the subsystem indicating normal operation of the subsystem and portions of the event data that precede and follow the event. The assessment module is configured to determine whether the event data indicates a fault associated with the subsystem by comparing the deviations to a threshold deviation. The training module is configured to update a model trained to identify faults in vehicles to identify the event as a fault associated with the subsystem of the vehicle based on the event data in response to the deviations indicating a fault associated with the subsystem.

17 Claims, 8 Drawing Sheets

ADAPTIVE PROGNOSTICS SYSTEMS AND METHODS FOR VEHICLES

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates generally to prognostics systems and methods for vehicles and more particularly to adaptive prognostics using distance and temporal self-assessment.

Diagnostics and Prognostics (D&P) are important features of most modern vehicles. However, once a D&P system is deployed in the vehicles, it takes considerable amount of time and resources to refine and update the D&P system to handle corner cases (explained below in the detailed description section). Furthermore, most D&P systems only use one set of logic and calibrations for one vehicle program, which may not achieve desired performance to handle vehicle to vehicle variations.

SUMMARY

A system comprises an assessment module and a training module. The assessment module is configured to receive event data about an event associated with a subsystem of a vehicle. The assessment module is configured to determine deviations between reference data for the subsystem indicating normal operation of the subsystem and portions of the event data that precede and follow the event. The assessment module is configured to determine whether the event data indicates a fault associated with the subsystem by comparing the deviations to a threshold deviation. The training module is configured to update a model trained to identify faults in vehicles to identify the event as a fault associated with the subsystem of the vehicle based on the event data in response to the deviations indicating a fault associated with the subsystem.

In other features, the assessment module is configured to add the event data to the reference data in response to the deviations not indicating a fault associated with the subsystem, and to use the reference data including the event data to determine deviations of subsequent events in the vehicle and in other vehicles.

In other features, the assessment module is further configured to identify one or more faulty components of the subsystem based on the deviations in response to the deviations indicating a fault associated with the subsystem.

In other features, the model is trained for use in vehicles manufactured in a different vehicle program or a different model year than that in which the vehicle is manufactured, and the training module is configured to update the model for use in the vehicle.

In other features, the model is trained for use in multiple vehicles, and the training module is configured to update the model for use in the vehicle.

In other features, the event includes a repair performed on the vehicle, and the assessment module is configured to update the model in response to the deviations of the portions of the event data preceding the event being greater than the threshold deviation and in response to the deviations of the portions of the event data following the event being less than the threshold deviation.

In other features, the event includes an indication of an operating condition of the subsystem, and the assessment module is configured to update the model in response to the deviations of the portions of the event data preceding the event being greater than the threshold deviation and in response to the deviations of the portions of the event data following the event remaining greater than the threshold deviation for a time period following the event.

In other features, the assessment module is further configured to normalize the event data and to select portions of the normalized data to determine the deviations.

In still other features, a method comprises receiving event data about an event associated with a subsystem of a vehicle, filtering the event data to remove outliers from the event data, and normalizing the filtered event data using a predetermined range. The method further comprises selecting data from the normalized data that precede and follow the event and determining deviations between reference data for the subsystem indicating normal operation of the subsystem and portions of the selected data that precede and follow the event. The method further comprises determining whether the event data indicates a fault associated with the subsystem by comparing the deviations to a threshold deviation. The method further comprises identifying one or more faulty components of the subsystem based on the deviations in response to the deviations indicating a fault associated with the subsystem. The method further comprises updating a model trained to identify faults in vehicles to identify the event as a fault associated with the subsystem based on the event data in response to the deviations indicating a fault associated with the subsystem.

In other features, the method further comprises adding the event data to the reference data in response to the deviations not indicating a fault associated with the subsystem, and using the reference data including the event data to determine deviations of subsequent events in the vehicle and in other vehicles.

In other features, the method further comprises training the model for use in vehicles manufactured in a different vehicle program or a different model year than that in which the vehicle is manufactured, and updating the model for use in the vehicle.

In other features, the event includes a repair performed on the vehicle, and the method further comprises updating the model in response to the deviations of the portions of the event data preceding the event being greater than the threshold deviation and in response to the deviations of the portions of the event data following the event being less than the threshold deviation.

In other features, the event includes an indication of an operating condition of the subsystem, and the method further comprises updating the model in response to the deviations of the portions of the event data preceding the event being greater than the threshold deviation and in response to the deviations of the portions of the event data following the event remaining greater than the threshold deviation for a time period following the event.

In still other features, a system comprises a processor and a memory storing instructions which when executed by the processor configure the processor to receive event data about an event associated with a subsystem of a vehicle. The instructions further configure the processor to determine deviations between reference data indicating normal operation of the subsystem and portions of the event data that precede and follow the event. The instructions further configure the processor to determine whether the event data indicates a fault associated with the subsystem by comparing the deviations to a threshold deviation. The instructions further configure the processor to update a model trained to identify faults in vehicles to identify the event as a fault associated with the subsystem based on the event data in response to the deviations indicating a fault associated with the subsystem. The model is trained for use in the vehicles manufactured in a different vehicle program or a different model year than that in which the vehicle is manufactured.

In other features, the instructions configure the processor to add the event data to the reference data in response to the deviations not indicating a fault associated with the subsystem, and to use the reference data including the event data to determine deviations of subsequent events in the vehicle and in other vehicles.

In other features, the instructions configure the processor to identify one or more faulty components of the subsystem based on the deviations in response to the deviations indicating a fault associated with the subsystem.

In other features, the event includes a repair performed on the vehicle, and the instructions configure the processor to update the model in response to the deviations of the portions of the event data preceding the event being greater than the threshold deviation and in response to the deviations of the portions of the event data following the event being less than the threshold deviation.

In other features, the event includes an indication of an operating condition of the subsystem, and the instructions configure the processor to update the model in response to the deviations of the portions of the event data preceding the event being greater than the threshold deviation and in response to the deviations of the portions of the event data following the event remaining greater than the threshold deviation for a time period following the event.

In other features, the instructions configure the processor to normalize the event data and to select portions of the normalized data to determine the deviations.

In other features, the instructions configure the processor to filter the event data to remove outliers from the event data.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
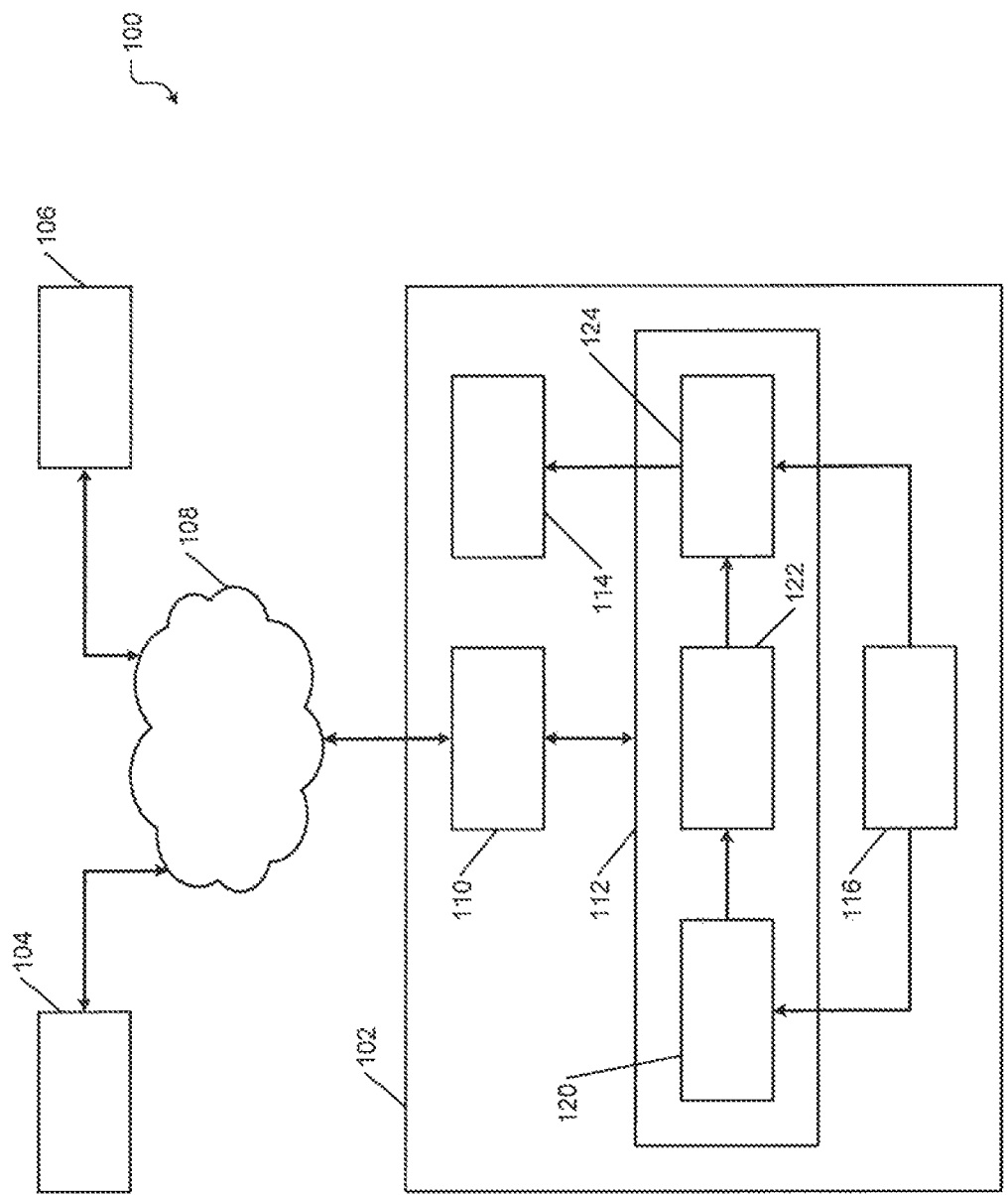
FIG. 1 shows an on-board adaptive prognostics system in a vehicle.

The present disclosure provides adaptive prognostics systems and methods in which a self-assessment approach is used to automatically evaluate typical events and to update the adaptive prognostics systems and methods for each vehicle or group of vehicles. The adaptive prognostics systems and methods use machine learning (ML)-based distance calculation approach to isolate faults. The adaptive prognostics systems and methods use temporal information to exclude noise/corner cases such as component break-in or sensor errors. The adaptive prognostics systems and methods use edge computing to customize or personalize Diagnostics and Prognostics (D&P) systems for each vehicle/ groups of vehicles.

A vehicle health management system comprises a diagnostics system, a prognostics system, and a fault mitigation system. The diagnostics system typically includes an on-board diagnostics module that indicates system level faults to the vehicle owner using indicators on the dashboard of the vehicle. The diagnostics system also includes advanced diagnostics used by service personnel to perform detailed fault analysis to find root cause of a problem down to component level. The on-board diagnostics module typically compares a signal level of a signal from a vehicle subsystem to a predetermined threshold and determines if the subsystem is faulty or not based on the result of the comparison. Service personnel typically use advanced diagnostics that can analyze signals from a plurality of components of the subsystem as well as other related subsystems and can determine the root cause of a problem down to component level.

The prognostics system can predict which component in the vehicle may fail in the near future. The prognostics system predicts a failure before the failure occurs. The prognostics system can assist the vehicle owner in scheduling service before the component fails. This way, the vehicle owner will not be stranded when the component fails. Some failures, however, occur suddenly and cannot be predicted. The fault mitigation system determines if the fault causing the failure can be mitigated. For example, some faults are marginal and can be mitigated to allow the vehicle to be driven for some time until the fault is rectified by servicing the vehicle.

Presently, engineers deliberately inject a fault in a test vehicle from a vehicle program and determine a fault signature. The engineers then develop a diagnostics and prognostics (D&P) system for handling the fault and implement the D&P system either in the vehicles or in a cloud. During further testing, if a false positive indication or an incorrect detection of the fault is encountered, the engineers adjust the D&P system to avoid the false positive indication or the incorrect detection of the fault. Thus, the development of the D&P system consumes time and resources.

Further, the D&P system is typically developed using one vehicle from a vehicle program as a test vehicle, and the same D&P system is used for all the vehicles manufactured under the vehicle program. However, vehicles in a program can have variations due to manufacturing and assembly tolerances, for example. Further, different vehicles manufactured and assembled in the same vehicle program may be driven in different conditions. Furthermore, different drivers can have different driving patterns. These varying factors require fine tuning of the D&P system for every vehicle on an ongoing basis. However, these factors cannot be analyzed and accounted for by testing every vehicle in a program. Further, these factors also cannot be easily simulated so that their impact on the D&P system can be analyzed and accounted for by fine tuning of the D&P system for every vehicle.

The present disclosure provides an adaptive D&P system that uses a self-assessment approach to automatically evaluate vehicle events and to update the D&P system for each vehicle or a group of vehicles on an ongoing basis. The adaptive D&P system can be implemented in a vehicle, at a data center in a cloud, and/or in a service tool used by service technicians.

Figure 2:
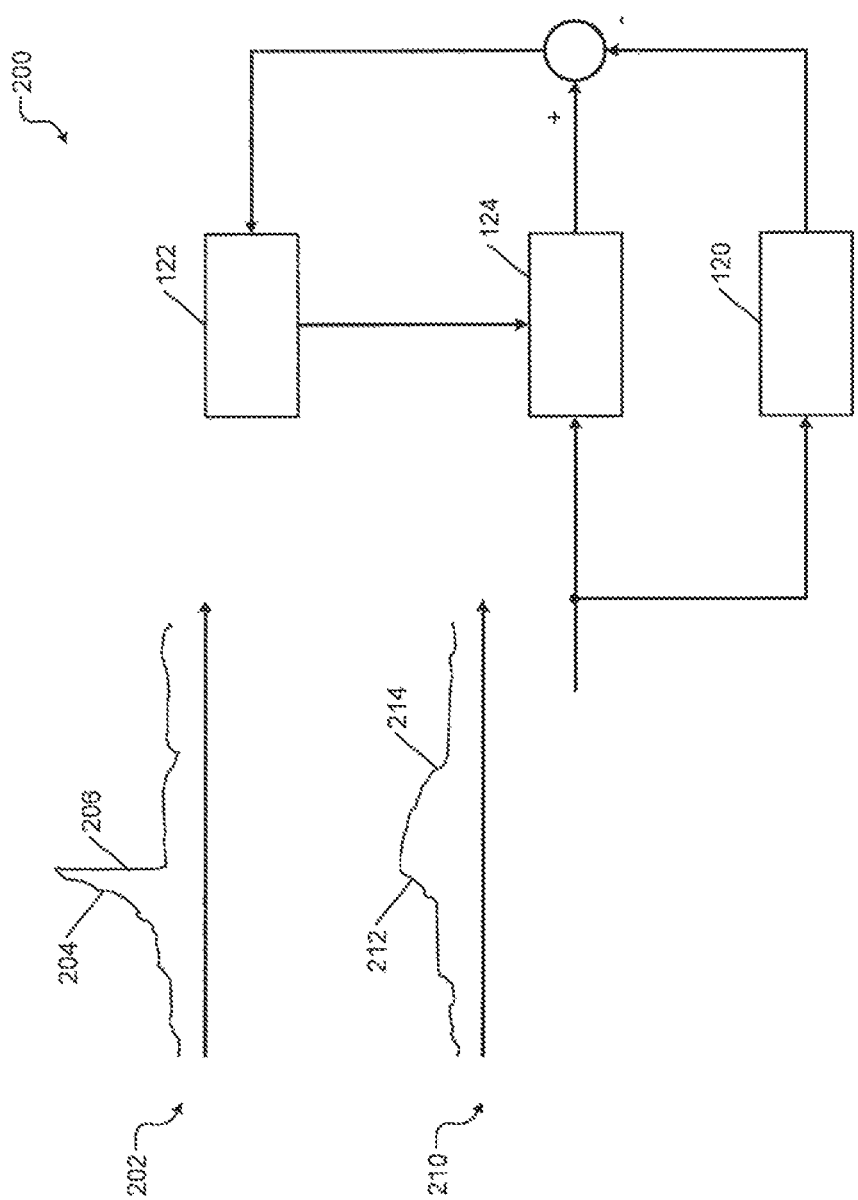
FIG. 2 shows a procedure used to update a diagnostics and prognostics (D&P) model in a vehicle based on event data.
Figure 3A:
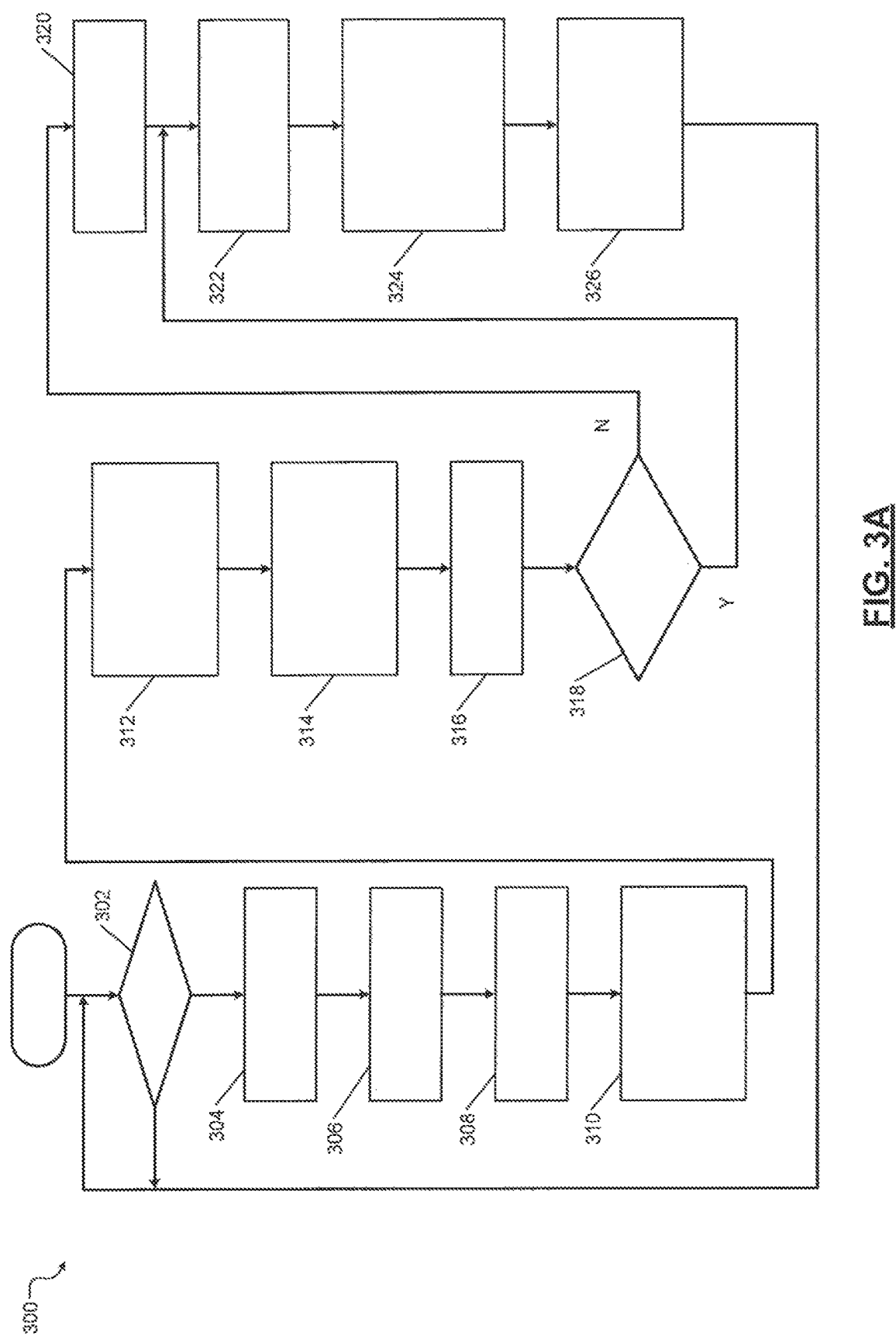
FIGS. 3A and 3B show a method of self-assessment used to update a D&P model in a vehicle.
Figure 3B:
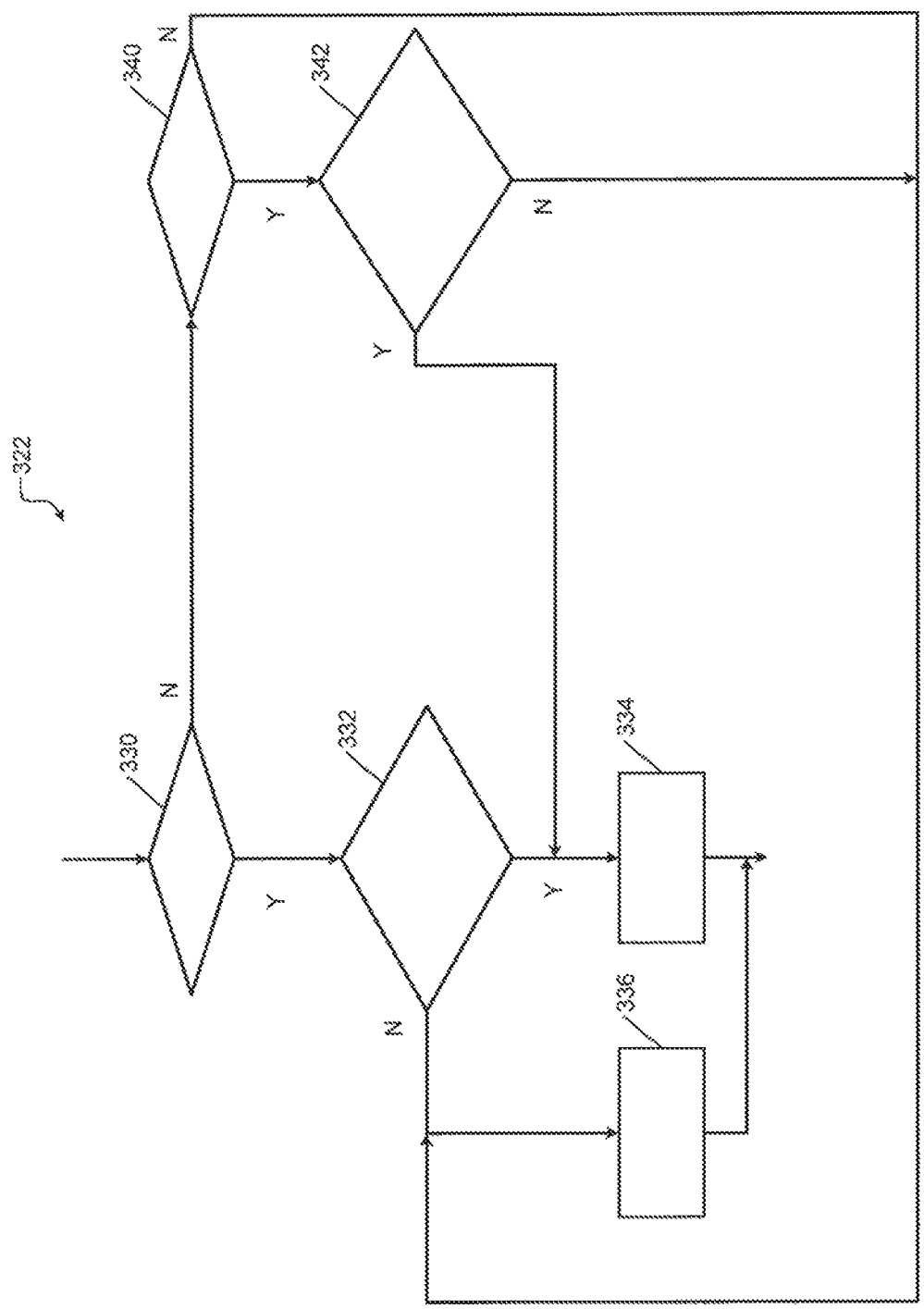
Figure 4A:
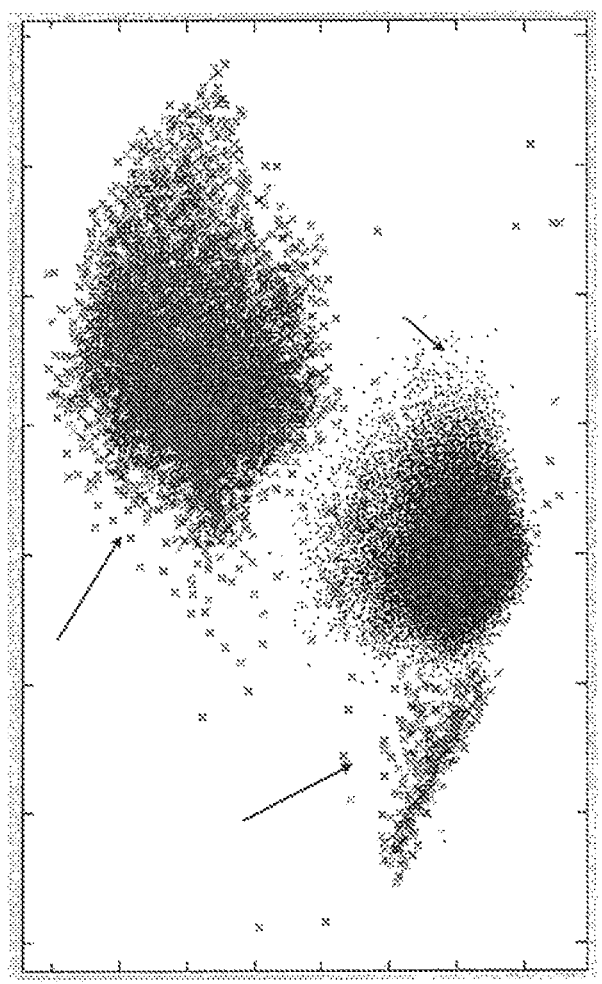
FIGS. 4A and 4B show examples of results obtained by using the adaptive prognostics system and the self-assessment method.
Figure 4B:
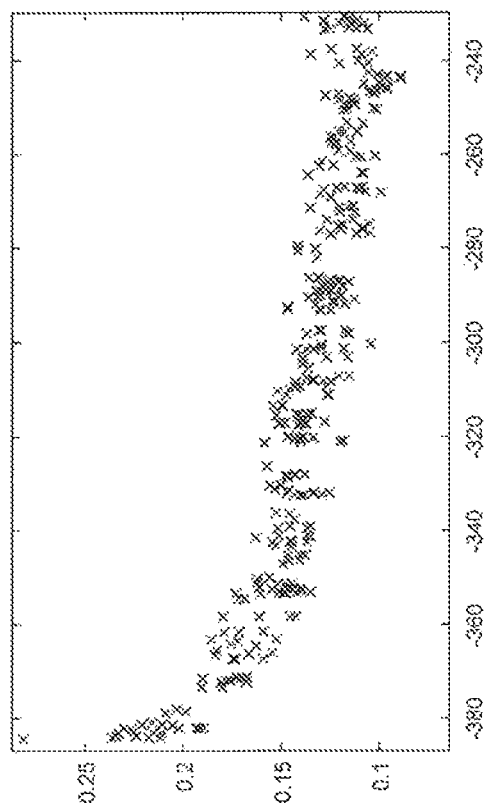
Figure 5A:
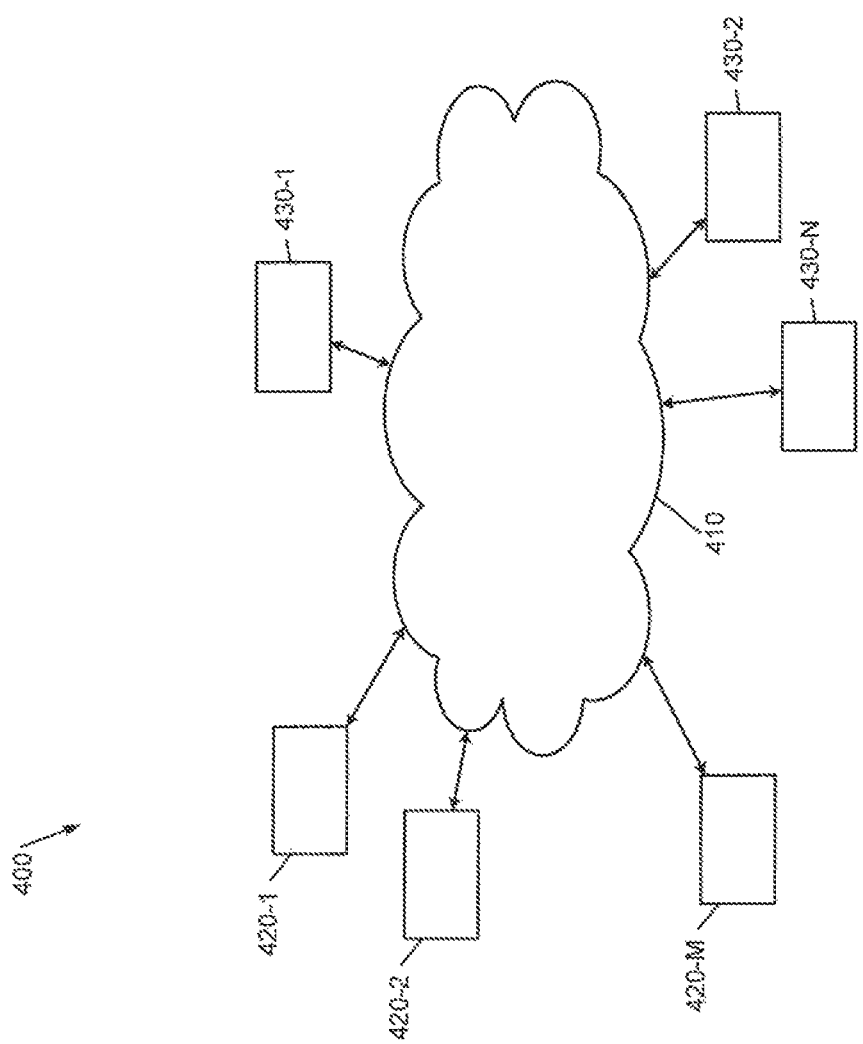
FIG. 5A shows a simplified example of a distributed computing system that can implement the adaptive prognostics system and the self-assessment method shown in FIGS. 1-3B.
Figure 5B:
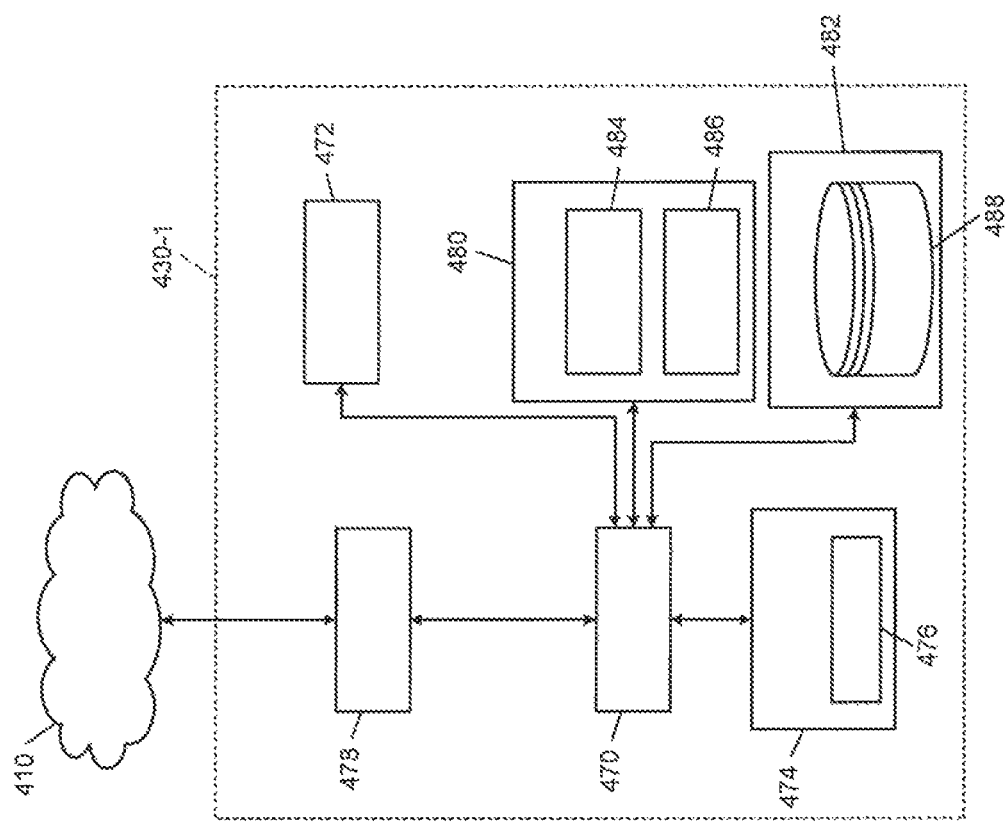
FIG. 5B shows a simplified example of a server of the distributed computing system of FIG. 5A.

The present disclosure is organized as follows. FIG. 1 shows an example of an on-board adaptive prognostics system in a vehicle. FIG. 2 shows an example of a procedure used to update a D&P model in a vehicle based on event data. FIGS. 3A and 3B show an example of a method of self-assessment used to update a D&P model in a vehicle. FIGS. 4A and 4B show examples of results obtained by using the adaptive prognostics system and the self-assessment method. FIGS. 5A and 5B show a client-server based distributed communication system that can be used to implement the adaptive D&P system. Thereafter, corner case, edge case, edge computing, edge device, and connected vehicle technology, which are referenced in the following description, are briefly explained for completeness.

FIG. 1 shows a schematic of an on-board adaptive prognostics system (hereinafter the system) 100 according to the present disclosure. The system 100 comprises a vehicle 102 that communicates with a vehicle fleet network 104 and a data center 106 via a distributed communication system 108, which is described below with reference to FIGS. 5A and 5B. The vehicle 102 comprises a telematics module 110, an adaptive prognostics module 112, an infotainment module 114, and an engine control module 116. The adaptive prognostics module 112 comprises a self-assessment module 120, a training module 122, and a diagnostics and prognostics (D&P) module 124.

The vehicle fleet network 104 may include, and provide data from, one or more networks such as Vehicle-to-Vehicle (V2V), Vehicle-to-Infrastructure (V2I), Vehicle-to-Network (V2N), and so on, which are explained below after the description of FIGS. 5A and 5B. The data center 106 comprises servers (e.g., servers shown and described below with reference to FIGS. 5A and 5B) configured to perform the data processing and analysis described below. The telematics module 110 comprises one or more transceivers compliant with different communication protocols to communicate with the distributed communication system 108.

The infotainment module 114 comprises audiovisual interfaces such as a display screen on the dashboard, various indicators for indicating operating conditions of the vehicle and indicating alarms/alerts, components for receiving inputs from the driver, and so on. The infotainment module 114 also comprises one or more infotainment systems such as radio, TVs, navigation system, and so on.

The ECM 116 controls the engine of the vehicle 102 and communicates with other control modules that control other subsystems of the vehicle 102 (not shown). Examples of the other subsystems include but are not limited to a transmission subsystem, a suspension subsystem, a braking subsystem, an autonomous vehicle control subsystem, and so on. For example, the ECM 116 may communicate with these other control modules via a controller area network (CAN) bus in the vehicle 102. All of the control modules communicate with various sensors in the respective subsystems and control the respective subsystems using various actuators based on data received from the sensors.

The telematics module 110 consolidates all the data from the vehicle fleet network 104. The vehicle 102 functions as an edge device (explained below after the description of FIGS. 5A and 5B). The adaptive prognostics module 112 processes the data from the telematics module 110 and the ECM 116 using edge computing (also explained below after the description of FIGS. 5A and 5B).

The D&P module 124 comprises a D&P model that is pre-trained at the factory to perform diagnostics and prognostics operations on all the vehicles in a vehicle program to which the vehicle 102 belongs. Accordingly, the pre-trained D&P model is the standard default or base model common for all the vehicles in a vehicle program to which the vehicle 102 belongs and is called a base model hereinafter. The D&P module 124 initially performs the diagnostics and prognostics operations based on data received from the ECM 116 using the base model.

Throughout the present disclosure, the ECM 116 is shown only as an example of a source of data for the D&P module 124 and the self-assessment module 120. Alternatively or additionally, the D&P module 124 and the self-assessment module 120 can receive data from any other control modules controlling any other subsystems described above.

As the vehicle 102 is driven, the self-assessment module 120 monitors and assesses events (e.g., faults that have occurred or that are likely to occur) based on data received from the ECM 116 (or other control modules) as explained below with reference to FIGS. 3A and 3B. The training module 122 further trains and fine-tunes the base model in the D&P module 124. For example, the training module 122 updates the base model or updates the rules and/or parameters of the base model based on the assessment of the events performed by the self-assessment module 120 as explained below with reference to FIGS. 3A and 3B. As the use of the vehicle 102 continues, the training module 122 continues to train and fine-tune the base model in the D&P module 124.

With the ongoing training and fine tuning of the base model, the D&P module 124 can now provide improved diagnostics and prognostics data (e.g., faults that have occurred or that are likely to occur, fault mitigation procedures, etc.) to the infotainment module 114 based on the fine-tuned model. The improved diagnostics and prognostics data is more accurate than that provided by the base model and is customized for the vehicle 102. The diagnostics and prognostics data can be used by the driver of the vehicle 102, service personnel servicing the vehicle 102, and/or a fleet manager associated with the vehicle 102.

In some instances, the event (e.g., a potential fault condition) being processed may not require an immediate notification to the driver. In other instances, the event processing may be complex and may require more processing power than that available in the vehicle 102. In such instances, the event processing can be offloaded and performed at the data center 106. The data center 106 can then send the updates to the vehicle 102 with which to update the base model in the vehicle 102. The telematics module 110 can download the updates from the data center 102 and can update the base model in the D&P module 124.

In yet another scenario, the entire adaptive prognostics module 112 may be implemented in the data center 106 instead of in the vehicle 102. In such a scenario, the adaptive prognostics module 112 can be accessed by the vehicle 102 (e.g., via the telematics module 110) on a subscription basis as Software-as-a-Service (SaaS). For example, the telematics module 110 can periodically (e.g., in batches) or in real time send data about events in the vehicle 102 to the adaptive prognostics module 112 implemented in the data center 106. In response, the telematics module 110 can periodically receive diagnostics and prognostics indications about the events in the vehicle 102 from the adaptive prognostics module 112 implemented in the data center 106. Alternatively, while not shown, the adaptive prognostics module 112 may also be implemented in a computing device or devices used by service personnel. The vehicle 102 and the data center 106 can communicate with these computing devices via the distributed communication system 108.

FIG. 2 shows an example of a procedure 200 used to update the base model in the D&P module 124 based on event data. The event data can include data about a repair performed on the vehicle 102 or an alert generated by the D&P module 124. For example, the alert may be a diagnostics alert indicating a fault that has already occurred or a prognostics alert indicating a fault that can occur in the near future.

Since the vehicle 102 operates, or is expected to operate, properly most of the time, most of the data collected by the ECM 116 is generally healthy data (i.e., data that does not indicate any fault). Such healthy data need not be used to update the base model. Since the objective of the adaptive prognostics module 112 is to diagnose and/or predict events, only event data is processed and used to fine-tune the base model.

For example, in an event that triggers processing of the event data by the adaptive prognostics module 112, an alert generated by the base model may indicate that a data value from a component that generated the alert deviated from the healthy data value and is therefore abnormal. However, the adaptive prognostics module 112 needs to determine if the component is in fact faulty, is failing, or is operating normally (i.e., if the alert is a false positive).

FIG. 2 shows examples of data from a battery of the vehicle 102. In example 202, an internal resistance of the battery keeps increasing with time as shown at 204 until the battery dies and is replaced so that the internal resistance suddenly drops to a normal range as shown at 206. In example 210, the internal resistance of the battery keeps increasing with time as shown at 212 (e.g., may be due to extremely cold weather) but then returns to a normal value over time as the vehicle 102 is driven and as the battery warms up as shown at 214. The self-assessment module 120 processes data in both the examples and can determine that in the example 202, the battery is faulty (i.e., it is a bad component) and that in the example 210, the battery is not faulty but is in fact operating normally (i.e., it is a healthy component).

Thus, while both types of data, which are shown in examples 202 and 210, will generate an alert, only the data in example 202 generates a proper or true alert indicating that the battery is in fact faulty. In contrast, the data in example 210 generates an improper alert (a false alarm) since the battery is in fact not faulty but is healthy. Rather, the data in example 210 simply indicates that the performance of the battery is temporarily degraded but is recoverable in a short period of time. The adaptive prognostics module 112 can distinguish between the two types of data and can prevent the data in example 210 from generating a false alarm as explained below.

Typically, engineers would have to analyze the data in the two examples, analyze the variables surrounding the two types of data, and conclude that only the alert caused by the data in example 202 is a true alert and that the alert caused by the data in example 210 is a false alert.

Instead, in the adaptive prognostics module 112, the self-assessment module 120 analyzes the data in the two examples and determines that only the alert caused by the data in example 202 is a true alert and that the alert caused by the data in example 210 is a false alert.

The self-assessment module 120 labels the data similar to that shown in example 202 as received from a bad (faulty) component and labels the data similar to that shown in example 210 as received from a good (healthy) component. Thus, the assessment of the event data performed by the self-assessment module 120 is an automated process instead of a manual process currently followed by engineers.

Based on the labeling, the training module 122 uses, for example, machine learning to update the base model in the D&P module 124. Note that machine learning is only one example, and other ways may be used to update the base model in the D&P module 124. For example, an optimization algorithm may be used to change the thresholds described below. Accordingly, when the updated model subsequently receives data similar to that shown in example 202, the updated model generates an alert indicating a faulty component. However, when the updated model subsequently receives data similar to that shown in example 210, the updated model does not generate an alert and prevents a false alarm.

The event data can also include data about a repair/replacement of a component performed in the vehicle 102. However, sometimes, more than one component is repaired/replaced while only one of the components is in fact faulty. For example, in a repair/replacement performed for a brake related problem, both the rotor and the brake pad may be repaired/replaced when in fact only the brake pad may be faulty. In other situations, for customer satisfaction, a marginally failing component may be replaced although the component is not in fact faulty. Such repair/replacement event data can be filtered and excluded from analysis by the self-assessment module 120 so that inaccurate data is not used to update the model.

The repair/replacement event data can be filtered in many ways. For example, the filtering can be performed by comparing data collected before a repair/replacement to data collected after the repair/replacement. If the data before and after the repair/replacement are substantially similar, the repair/replacement event data is not used to update the model. Other ways of filtering include analyzing labor/service codes available in the cloud, which can indicate whether the repaired/replaced component was in fact faulty.

Thus, since the event data, which includes data associated with both D&P alerts and repair/replacement events, is assessed, filtered, and used to update the model on an ongoing basis, no calibration is required for vehicle program/model year variation. Furthermore, based on the updates performed in one vehicle program/model year, the base model for another vehicle program/model year can be improved. For example, the updated model for one vehicle program/model year can be used as a base model for another vehicle program/model year.

Further, the objective of the adaptive prognostics system of the present disclosure is not limited to providing only binary decisions such as whether a component is faulty (bad component) or healthy (good component). Rather, the assessment may include more than two classes, and the objective includes indicating one or more conditions between faulty (bad) and healthy (good). For example, one such condition between faulty (bad) and healthy (good) can be to indicate whether the condition of a component is marginal. Further, there can be gradation or levels of marginality. This allows the vehicle owner time to plan for servicing the vehicle.

FIGS. 3A and 3B show an example of a method 300 for self-assessment of events used by the self-assessment module 120 to update (i.e., train and fine tune) the base model in the vehicle 102. The method 300 is triggered by the occurrence of an event (e.g., a D&P alert or repair/replacement of a component). In FIG. 3A, at 302, the method 300 determines whether a new event (e.g., a D&P alert or repair/replacement of a component) has occurred. For example, the method 300 determines whether a new event is a correct alert (repair) or a false alert (repair).

At 304, the method 300 loads the current event data and pre-defined healthy data, which can be used as reference for evaluating the event data. At 306, the method 300 filters the event data and removes any outliers (abnormalities) from the event data. At 308, the method 300 normalizes the filtered event data. For example, data from different components may be of different types and may have values measured in different units and in different scales. For example, the data can include voltages, currents, temperatures, and so on. These data values can be normalized using predefined ranges to facilitate processing of the data. For example, all the data for the voltages, currents, temperatures, and so on associated with the event can be normalized to data values in a range between 0 and 1. The normalization eliminates calibration of the D&P model.

In some events, the event data may include data from many components. Not all of the data can be assessed. Only selected data can be assessed. At 310, a statistical procedure such as principal component analysis (PCA, explained below after the description of FIGS. 5A and 5B) or any other feature selection scheme can be used to select data from the event data for analysis to reduce data dimension.

At 312, the method 300 calculates the distance (i.e., deviation or difference) between the selected event data and the corresponding healthy data. Depending on the data, the distance may be linear (2D) or spatial (i.e., multi-dimensional). Further, the distance may be directional and therefore a vector.

The distance between the selected event data and the corresponding healthy data can be measured using various methods. For example, the methods can include but are not limited to K nearest neighbor (KNN), Gaussian mixture model (GMM), support vector machine (SVM), and so on.

Notably, although the healthy data may shift up or down from one model year to another in a vehicle program or from one vehicle program to another, the shift is rendered irrelevant by measuring the distance since the same shift is also reflected in the event data. Therefore, measuring the distance between the selected event data and the corresponding healthy data, eliminates calibration of the D&P model for each model year or for each vehicle program.

At 314, since the event data includes time series data, the method 300 calculates a plurality of distances (i.e., deviations or differences) between the selected event data and the corresponding healthy data at predetermined times before and after the time of the event. At 316, the method loads a threshold distance (i.e., a threshold deviation or difference) from the healthy data. At 318, the method 300 determines whether any of the calculated distances is greater than or equal to the threshold distance.

At 320, if none of the calculated distances is greater than the distance threshold (i.e., if all the calculated distances are less than the threshold distance), the method 300 labels the event data as healthy data and updates the D&P model by adding to it the newly labeled healthy data, which improves subsequent event analysis and processing. Thus, the method 300 increases the amount of healthy data available for implementing the base model in the subsequent model year or in another vehicle program without requiring additional calibration for developing the base model for the subsequent model year or in another vehicle program.

At 322, if any of the calculated distances is greater than the threshold distance, the method 300 performs a trend analysis and labels the event data as faulty or healthy as described below with reference to FIG. 3B. At 324, the method 300 determines further details about the failure or failures associated with the event based on the calculated distances. For example, the method 300 can determine if only a component of an assembly and not the entire assembly is faulty. Based on the details, the method 300 can determine whether a repair/replacement should be performed immediately or it can be deferred and scheduled to be performed later. The method 300 can make these determinations according to predefined rules or the trained model. After 324 and 320, the method 300 provides the results of labeling the event data to the D&P model for self-evolving the D&P model.

For some applications, the distance can be in other forms (e.g., distance vector, area under the curve, etc.) to separate healthy and faulty components. Further, the signals used in self-assessment can include fault signatures (e.g., pattern of change in internal resistance of a battery), behavior data (e.g., hard braking), environmental data (e.g., ambient temperature), and/or signals from upstream/downstream components relative to the component associated with the event data.

FIG. 3B shows details of the trend analysis and labeling of the event data described at 322 in FIG. 3A. There are two types of events: a repair/replacement event or a D&P alert event. At 330, the method 300 determines the type of the current event. At 332, if the current event is a repair/replacement event, the method 300 determines if the distance between the event data and the healthy data is high (e.g., greater than or equal to a predetermined threshold) before the event and low (e.g., less than or equal to a predetermined threshold) after the event. At 334, the method 300 labels the event data as faulty if the distance between the event data and the healthy data is high before the event and low after the event. At 336, the method 300 labels the event data as healthy if the distance between the event data and the healthy data is not high before the event and low after the event.

At 340, if the current event is not a repair/replacement event, the method 300 determines if the current event is a D&P alert event. The method returns to 336 if the current event is not a D&P alert event. At 342, if the current event is a D&P alert event, the method 300 determines if the distance between the event data and the healthy data is high before the event and remains high after the event for a predetermined time period, which will be the case if the vehicle 102 generated the alert but is not yet repaired. The method 300 returns to 334 if the distance between the event data and the healthy data is high before the event and remains high after the event for a predetermined time period. The method 300 returns to 336 if the distance between the event data and the healthy data is not high before the event and high after the event for a predetermined time period (i.e., it is a false alarm). From 334 and 336, the method 300 returns to 324 in FIG. 3A.

The adaptive prognostics module 112 can identify or detect a repair/replacement through warranty data that can be downloaded by the telematics module 110 from the cloud/technician tool or based on ECM reset, which may be performed after the repair/replacement. Thus, the repair event can be identified from the vehicle as well; for example, an onboard algorithm in the vehicle may detect whether a service technician reset a diagnostic trouble code (DTC) and/or a counter in the ECM 116. The alert information can be downloaded from the cloud (for a fleet) or can be fetched from memory (e.g., in the ECM module 116 and/or the D&P module 124) in the vehicle 102.

FIGS. 4A and 4B show examples of results obtained by using the adaptive prognostics system and the self-assessment method. FIG. 4A shows that the adaptive prognostics system and the self-assessment method can identify faults in a fuel system. The system and method can identify a faulty fuel pump motor and a faulty fuel pressure sensor based on the distances between the data from the motor and the senor and the healthy data associated with the fuel system. FIG. 4B shows results obtained by using the system and method on a battery and a starter. The results show that although the distance between the event data associated with the battery and the starter and corresponding healthy data is high, the component (i.e., the battery and the starter) is healthy based on the downward trend information.

Thus, the systems and methods of the present disclosure provide customized or personalized adaptive diagnostics and prognostics for each vehicle using edge computing and by assessing event data using distance and temporal information. The systems and methods use healthy data to automatically obtain the calibration parameters, use ML-based distance calculation to detect faulty events, use ML-based distance and distribution (location/direction) information (e.g., as shown in FIGS. 4A and 4B) to isolate different failure modes or types, and use temporal information to remove large distance noise, e.g., break-in/faulty data from the event data as described above.

Below are simplistic examples of a distributed computing environment in which the systems and methods of the present disclosure can be implemented. Throughout the description, references to terms such as servers, client devices, applications and so on are for illustrative purposes only. The terms server and client device are to be understood broadly as representing computing devices with one or more processors and memory configured to execute machine readable instructions. The terms application and computer program are to be understood broadly as representing machine readable instructions executable by the computing devices.

FIG. 5A shows a simplified example of a distributed computing system 400. The distributed computing system 400 includes a distributed communications system 410, one or more vehicles 420-1, 420-2, ..., and 420-M (collectively, vehicles 420), and one or more servers 430-1, 430-2, ..., and 430-N (collectively, servers 430). M and N are integers greater than or equal to one. The distributed communications system 410 may include a local area network (LAN), a wide area network (WAN) such as the Internet, or other type of network. For example, the distributed communication system 422 may be similar to the distributed communications system 410. The vehicles 420 and the servers 430 may be located at different geographical locations and may communicate with each other via the distributed communications system 410. For examples the servers 430 may be located in the data center 420 in a cloud. The vehicles 320 and the servers 430 may connect to the distributed communications system 410 using wireless and/or wired connections.

The vehicles 420 may include the system 400 described above that may execute software applications such as the method 400 described above. The servers 430 may provide multiple services to the client devices 420. For example, the servers 430 may execute software applications developed by one or more vendors (e.g., the backend system for event processing and model updating described above). The servers 430 may host multiple databases that are relied on by the software applications in providing services to users of the vehicles 420.

FIG. 5B shows a simplified example of the server 430-1. The server 430-1 typically includes one or more CPUs or processors 470, a network interface 478, memory 480, and bulk storage 482. In some implementations, the server 430-1 may be a general-purpose server and include one or more input devices 472 (e.g., a keypad, touchpad, mouse, and so on) and a display subsystem 474 including a display 476.

The network interface 478 connects the server 430-1 to the distributed communications system 410. For example, the network interface 478 may include a wired interface (e.g., an Ethernet interface) and/or a wireless interface (e.g., a Wi-Fi, Bluetooth, near field communication (NFC), or other wireless interface). The memory 480 may include volatile or nonvolatile memory, cache, or other type of memory. The bulk storage 482 may include flash memory, one or more magnetic hard disk drives (HDDs), or other bulk storage devices.

The processor 470 of the server 430-1 executes an operating system (OS) 484 and one or more server applications 486 (e.g., the backend system for event processing and model updating described above), which may be housed in a virtual machine hypervisor or containerized architecture. The bulk storage 482 may store one or more databases 488 that store data structures used by the server applications 486 to perform respective functions.

The following description briefly explains corner case, edge case, edge computing, edge device, and connected vehicle technology referenced above. In engineering, a corner case involves a problem or situation that occurs only outside of normal operating parameters—specifically one that manifests itself when multiple environmental variables or conditions are simultaneously at extreme levels, even though each parameter is within the specified range for that parameter.

An edge case is a problem or situation that occurs only at an extreme (maximum or minimum) operating parameter. For example, a stereo speaker might noticeably distort audio when played at maximum volume, even in the absence of any other extreme setting or condition. Non-trivial edge cases can result in the failure of an object that is being engineered. These cases may not have been foreseen during design phase and may not have been thought possible during normal use of the object.

Edge computing is a distributed computing paradigm that brings computation and data storage closer to the location where it is needed, to improve response times and save bandwidth. For example, the proliferation of IoT devices at the edge of a network is producing massive amounts of data to be computed to data centers, pushing network bandwidth requirements to the limit. Despite improvements in network technology, data centers cannot guarantee acceptable transfer rates and response times, which could be a critical requirement for many applications. Furthermore devices at the edge constantly consume data coming from the cloud, forcing companies to build content delivery networks to decentralize data and service provisioning, leveraging physical proximity to the end user.

Edge computing moves the computation away from data centers towards the edge of the network, exploiting smart objects, mobile phones or network gateways (such as those present in modern vehicles) to perform tasks and provide services on behalf of the cloud. By moving services to the edge, it is possible to provide content caching, service delivery, storage and IoT management, resulting in better response times and transfer rates.

At the same time, distributing the logic in different network nodes introduces new issues and challenges. The distributed nature of this paradigm introduces a shift in security schemes used in cloud computing. Not only data should be encrypted, but different encryption mechanism should be adopted, since data may transit between different distributed nodes connected through the Internet before eventually reaching the cloud. Edge nodes (edge devices) may also be resource constrained devices, limiting the choice in terms of security methods. Moreover, a shift from centralized top-down infrastructure to a decentralized trust model is required. On the other hand, by keeping data at the edge, it is possible to shift ownership of collected data from service providers to end-users.

Scalability in a distributed network faces different issues. For example, it needs take into account the heterogeneity of the devices, having different performance and energy constraints, the highly dynamic condition and the reliability of the connections, compared to more robust infrastructure of cloud data centers. Moreover, security requirements introduce further latency in the communication between nodes, which may slow down the scaling process.

Edge application services reduce volumes of data that needs to be moved, the consequent traffic, and the distance that data needs to travel, which lowers latency and reduces transmission costs. However, computation offloading for every task may also result in a slowdown due to transfer times.

An edge device is a device which provides an entry point into enterprise or service provider core networks. Examples include routers, routing switches, integrated access devices (IADs), multiplexers, and a variety of metropolitan area network (MAN) and wide area network (WAN) access devices. Examples also include modern semi-autonomous and autonomous vehicles. Edge devices also provide connections into carrier and service provider networks. An edge device that connects a local area network to a high speed switch or backbone (such as an ATM switch) may be called an edge concentrator.

In general, edge devices are normally routers that provide authenticated access (most commonly PPPoA and PPPoE) to faster, more efficient backbone and core networks. The trend is to make the edge device smart and the core devices dumb and fast. Therefore, edge routers often include Quality of Service (QoS) and multi-service functions to manage different types of traffic. Consequently, core networks are often designed with switches that use routing protocols such as Open Shortest Path First (OSPF) or Multiprotocol Label Switching (MPLS) for reliability and scalability, allowing edge routers to have redundant links to the core network. Links between core networks are different, for example Border Gateway Protocol (BGP) routers often used for peering exchanges.

The following are examples of technologies used in both autonomous driving and smart infrastructure: Vehicle-to-Vehicle (V2V), Vehicle-to-Everything (V2X), Vehicle-to-Infrastructure (V2I), Vehicle-to-Network (V2N), and High Definition (HD) mapping.

Vehicle-to-Vehicle (V2V): The first step towards a smart city is autonomous vehicles. Current automation systems found in today's vehicles rely mostly on sensors. Ultrasonic, radar, and camera technologies allow vehicles to see and analyze their surroundings and make safe decisions while driving. However, sensors have limited range and run into the same problems as humans do when it comes to hidden objects, roads, and generally unexpected behavior from other vehicles.

Vehicles equipped with vehicle-to-vehicle (V2V) communication technology can communicate with each other in real time and relay information. V2V allows vehicles to essentially see further and enhance the level of predictability. Vehicle-to-Everything (V2X) communication technology is used to connect vehicles to their surroundings. A vehicle with built-in electronics can communicate in real-time with its surroundings including V2V, vehicle-to-pedestrian (V2P), vehicle-to-roadway infrastructure (V2I), and vehicle-to-network (V2N) technologies. V2V communication can even be extended to the road as it can complement vehicle sensors and allow them to see even further by communicating vehicle direction and intent of lane changes to other vehicles.

Vehicle-to-Infrastructure (V2I): Smart cities need smart infrastructure that adapts to road conditions and allows for the most efficient throughput of traffic. There are two vehicle-to-infrastructure (V2I) technologies: Smart signals and smart parking.

Smart signals can play a key role in the process of creating smart infrastructure. Traditional signals have either Fixed Signal Timings (FST), which are programmed to change by time of day (i.e., rush hour) or they have In-pavement Detection (IPD) which can modify the signal timing slightly based on demand. Smart signals differ from traditional signals in two respects. First, they use cameras and/or sensors to detect if a car is waiting and also how many cars are waiting on each lane. Using this information, they can calculate the amount of time it will take to clear up each side. Second, smart signals can communicate with other nearby smart signals and can even be connected to the grid as a network of signals that can work in tandem and maximize traffic efficiency.

Smart parking is another example of a vehicle-to-infrastructure technology and goes hand in hand with autonomous driving. Essentially, smart parking removes any human intervention with parking from start to finish. Connected parking spaces allow communication from the parking lot to a vehicle, letting the vehicle know which spaces are available, the cost, and figuring out how long the car has been parked in order to charge the appropriate amount.

Vehicle-to-Network (V2N): Vehicle-to-network (V2N) systems connect vehicles to the cellular infrastructure and the cloud so drivers can take advantage of in-vehicle services like traffic updates and media streaming.

High Definition (HD) mapping: Self-driving cars use sensors to make calculations in real time. HD mapping is based on sensor data and the following. 3D spatial mapping data contains curvature, elevation, and width of lane, as well as the dimensions of any anomalies or obstacles on the road. Autonomous vehicles can use this data to make calculated turns, calculate speed prior to elevation changes to maximize engine efficiency and minimize fuel consumption. Municipalities can use this data to deploy fire trucks or autonomous drones.

Principal Component Analysis (PCA) is a statistical procedure that uses an orthogonal transformation to convert a set of observations of possibly correlated variables (entities each of which takes on various numerical values) into a set of values of linearly uncorrelated variables called principal components. This transformation is defined in such a way that the first principal component has the largest possible variance (i.e., accounts for as much of the variability in the data as possible), and each succeeding component in turn has the highest variance possible under the constraint that it is orthogonal to the preceding components. The resulting vectors (each being a linear combination of the variables and containing n observations) are an uncorrelated orthogonal basis set. PCA is sensitive to the relative scaling of the original variables.

PCA is mostly used as a tool in exploratory data analysis and for predictive modeling. It is often used to visualize genetic distance and relatedness between populations. PCA can be performed by eigenvalue decomposition of a data covariance (or correlation) matrix of singular value decomposition of a data matrix, usually after a normalization step of the initial data. The normalization of each attribute consists of mean centering—subtracting each data value from its variable's measured mean so that its empirical mean (average) is zero—and, possibly, normalizing each variable's variance to make it equal to 1. The results of a PCA are usually discussed in terms of component scores, sometimes called factor scores (the transformed variable values correspond to a particular data point), and loadings (the weight by which each standardized original variable should be multiplied to get the component score). If component scores are standardized to unit variance, loadings contain the data variance (and that is the magnitude of eigenvalues). If component scores are not standardized (therefore, they contain the data variance), loadings are unit-scaled (i.e., normalized), and these weights are called eigenvectors.

PCA is the simplest of the true eigenvector-based multivariate analyses. Often, its operation can be thought of as revealing the internal structure of the data in a way that best explains the variance in the data. If a multivariate dataset is visualized as a set of coordinates in a high-dimensional data space (1 axis per variable), PCA can supply the user with a lower-dimensional picture, a projection of this object when viewed from its most informative viewpoint. This is done by using only the first few principal components so that the dimensionality of the transformed data is reduced.

PCA is closely related to factor analysis. Factor analysis typically incorporates more domain specific assumptions about the underlying structure and solves eigenvectors of a slightly different matrix. PCA is also related to canonical correlation analysis (CCA). CCA defines coordinate systems that optimally describe the cross-covariance between two datasets while PCA defines a new orthogonal coordinate system that optimally describes variance in a single dataset.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip (SoC).

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system comprising:
 an assessment module configured to:
  receive event data about an event associated with a subsystem of a vehicle, wherein the event includes an indication of an operating condition of the subsystem;
  determine deviations between reference data for the subsystem indicating normal operation of the subsystem and portions of the event data that precede and follow the event; and
  determine whether the event data indicates a fault associated with the subsystem by comparing the deviations to a threshold deviation; and
 a training module configured to update a model trained to identify faults in vehicles to identify the event as a fault associated with the subsystem of the vehicle based on the event data in response to the deviations indicating a fault associated with the subsystem;
 wherein the assessment module is configured to update the model in response to the deviations of the portions of the event data preceding the event being greater than the threshold deviation and in response to the deviations of the portions of the event data following the event remaining greater than the threshold deviation for a time period following the event.

2. The system of claim 1 wherein the assessment module is configured to:
 add the event data to the reference data in response to the deviations not indicating a fault associated with the subsystem; and
 use the reference data including the event data to determine deviations of subsequent events in the vehicle and in other vehicles.

3. The system of claim 1 wherein the assessment module is further configured to identify one or more faulty components of the subsystem based on the deviations in response to the deviations indicating a fault associated with the subsystem.

4. The system of claim 1 wherein the model is trained for use in vehicles manufactured in a different vehicle program or a different model year than that in which the vehicle is manufactured and wherein the training module is configured to update the model for use in the vehicle.

5. The system of claim 1 wherein the model is trained for use in multiple vehicles and wherein the training module is configured to update the model for use in the vehicle.

6. The system of claim 1 wherein the event includes a repair performed on the vehicle and wherein the assessment module is configured to update the model in response to the deviations of the portions of the event data preceding the event being greater than the threshold deviation and in response to the deviations of the portions of the event data following the event being less than the threshold deviation.

7. The system of claim 1 wherein the assessment module is further configured to normalize the event data and to select portions of the normalized data to determine the deviations.

8. A method comprising:
 receiving event data about an event associated with a subsystem of a vehicle, wherein the event includes an indication of an operating condition of the subsystem;
 filtering the event data to remove outliers from the event data;
 normalizing the filtered event data using a predetermined range;
 selecting data from the normalized data that precede and follow the event;
 determining deviations between reference data for the subsystem indicating normal operation of the subsystem and portions of the selected data that precede and follow the event;
 determining whether the event data indicates a fault associated with the subsystem by comparing the deviations to a threshold deviation;

identifying one or more faulty components of the subsystem based on the deviations in response to the deviations indicating a fault associated with the subsystem;

updating a model trained to identify faults in vehicles to identify the event as a fault associated with the subsystem based on the event data in response to the deviations indicating a fault associated with the subsystem; and updating the model in response to the deviations of the portions of the event data preceding the event being greater than the threshold deviation and in response to the deviations of the portions of the event data following the event remaining greater than the threshold deviation for a time period following the event.

9. The method of claim 8 further comprising:

adding the event data to the reference data in response to the deviations not indicating a fault associated with the subsystem; and using the reference data including the event data to determine deviations of subsequent events in the vehicle and in other vehicles.

10. The method of claim 8 further comprising:

training the model for use in vehicles manufactured in a different vehicle program or a different model year than that in which the vehicle is manufactured; and updating the model for use in the vehicle.

11. The method of claim 8 wherein the event includes a repair performed on the vehicle, the method further comprising updating the model in response to the deviations of the portions of the event data preceding the event being greater than the threshold deviation and in response to the deviations of the portions of the event data following the event being less than the threshold deviation.

12. A system comprising:

a processor; and a memory storing instructions which when executed by the processor configure the processor to:

receive event data about an event associated with a subsystem of a vehicle, wherein the event includes an indication of an operating condition of the subsystem;

determine deviations between reference data indicating normal operation of the subsystem and portions of the event data that precede and follow the event;

determine whether the event data indicates a fault associated with the subsystem by comparing the deviations to a threshold deviation; and update a model trained to identify faults in vehicles to identify the event as a fault associated with the subsystem based on the event data in response to the deviations indicating a fault associated with the subsystem, wherein the model is trained for use in the vehicles manufactured in a different vehicle program or a different model year than that in which the vehicle is manufactured; and wherein the instructions configure the processor to update the model in response to the deviations of the portions of the event data preceding the event being greater than the threshold deviation and in response to the deviations of the portions of the event data following the event remaining greater than the threshold deviation for a time period following the event.

13. The system of claim 12 wherein the instructions configure the processor to:

add the event data to the reference data in response to the deviations not indicating a fault associated with the subsystem; and use the reference data including the event data to determine deviations of subsequent events in the vehicle and in other vehicles.

14. The system of claim 12 wherein the instructions configure the processor to identify one or more faulty components of the subsystem based on the deviations in response to the deviations indicating a fault associated with the subsystem.

15. The system of claim 12 wherein the event includes a repair performed on the vehicle, and wherein the instructions configure the processor to update the model in response to the deviations of the portions of the event data preceding the event being greater than the threshold deviation and in response to the deviations of the portions of the event data following the event being less than the threshold deviation.

16. The system of claim 12 wherein the instructions configure the processor to normalize the event data and to select portions of the normalized data to determine the deviations.

17. The system of claim 12 wherein the instructions configure the processor to filter the event data to remove outliers from the event data.

* * * * *